(12) United States Patent
Seo et al.

(10) Patent No.: US 7,439,103 B2
(45) Date of Patent: Oct. 21, 2008

(54) ORGANIC THIN FILM TRANSISTOR, METHOD FOR FABRICATING THE SAME, AND LIQUID CRYSTAL DISPLAY DEVICE WITH THE SAME

(75) Inventors: Hyun Sik Seo, Anyang-si (KR); Dae Hyun Nam, Goyang-si (KR); Nack Bong Choi, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 346 days.

(21) Appl. No.: 11/207,308

(22) Filed: Aug. 19, 2005

(65) Prior Publication Data
US 2006/0121643 A1 Jun. 8, 2006

(30) Foreign Application Priority Data
Dec. 3, 2004 (KR) .................. 10-2004-0101030

(51) Int. Cl.
*H01L 21/335* (2006.01)
*H01L 21/8232* (2006.01)

(52) U.S. Cl. .................. 438/142; 257/E51.001; 438/99

(58) Field of Classification Search .................. 438/99, 438/142, 149, 151, 155, 161, 176, 195, 278, 438/290, 585, 689, 690, 758
See application file for complete search history.

(56) References Cited

U.S. PATENT DOCUMENTS 6,335,539 B1 * 1/2002 Dimitrakopoulos et al. ... 257/40
2002/0006681 A1 * 1/2002 Yamanaka et al. ............ 438/29
2004/0129937 A1 * 7/2004 Hirai ............................ 257/40
2005/0029514 A1 * 2/2005 Moriya ........................ 257/40

FOREIGN PATENT DOCUMENTS

JP  2002-334830  11/2002
JP  2004-146575   5/2004

OTHER PUBLICATIONS

The Search Report dated May 4, 2006 for corresponding Korean Patent Application No. 10-2004-0101030.
*Self-Organized Organic Thin-Film Transistor for Flexible Active-Matrix Display*, by Sung Hwan Kim, Hye Young Choi, Seung Hoon Han, Ji Ho Hur and Jin Jang, Advanced Display Research Center, Kyung Hee University, Dongdaemoon-ku, Seoul 130-701, Korea, pp. 1294-1297.

* cited by examiner

*Primary Examiner*—Walter L. Lindsay, Jr.
*Assistant Examiner*—Kenisha V Ford
(74) *Attorney, Agent, or Firm*—Brinks Hofer Gilson & Lione

(57) ABSTRACT

An organic thin film transistor and a method for fabricating the same are disclosed. The method for fabricating the organic thin film transistor includes forming a gate electrode on a substrate. A gate insulating layer is formed on an entire surface of the substrate including the gate electrode, and source and drain electrodes are formed at a predetermined interval from each other on the gate insulating layer. An organic semiconductor layer is formed on the entire surface of the substrate and a first protection layer is formed on the organic semiconductor layer. The first protection layer is patterned and the organic semiconductor layer etched using the remaining first protection layer as a mask. A second protection layer is then formed on the entire surface of the substrate.

37 Claims, 8 Drawing Sheets

ORGANIC THIN FILM TRANSISTOR, METHOD FOR FABRICATING THE SAME, AND LIQUID CRYSTAL DISPLAY DEVICE WITH THE SAME

This application claims the benefit of Korean Application No. P2004-101030, filed on Dec. 3, 2004, which is hereby incorporated by reference as if fully set forth herein.

FIELD OF THE INVENTION

The present invention relates to an organic thin film transistor, and more particularly, to a semiconductor layer of an organic thin film transistor.

DISCUSSION OF THE RELATED ART

Unlike silicon thin film transistors, organic thin film transistors (OTFTs) can be used for main elements of flexible display, smart card, etc. In this respect, the organic thin film transistors have attracted great attention recently.

Amorphous silicon thin film transistors (TFTs) used in active matrix liquid crystal display (AMLCD), are fabricated at a high temperature about 360°. Thus, if it is desired to fabricate the amorphous silicon TFTs on a flexible substrate, a high-priced plastic substrate able to withstand the formation temperature is used. However, even if the TFT is fabricated on a flexible substrate, the TFT may be broken as it is fabricated from an inorganic substance.

If the thin film transistor is fabricated from organic substance, the fabrication can be performed at room temperature. Also, it is possible to use a plastic substrate having lightness and flexibility. As a result, the organic thin film transistor can be fabricated in a simplified process, so that it is possible to improve the yield. In this respect, the demands for organic thin film transistors, which can be fabricated at the room temperature and have great flexibility, have been increasing gradually. However, the organic thin film transistors have a low mobility of below 1 $cm^2/Vsec$, and also have low stability.

In order to overcome these problems, a method for using a semiconductor layer of pentacene in the organic thin film transistor is under study. The organic thin film transistor with the semiconductor layer of pentacene has high mobility and good stability.

Hereinafter, a related art organic thin film transistor with pentacene will be described with reference to the accompanying drawings.

FIG. 1 is a cross sectional view of a related art organic thin film transistor with pentacene applied thereto. FIG. 2 is a perspective view of a method for fabricating a related art organic thin film transistor with pentacene applied thereto.

Referring to FIG. 1, a gate electrode 12 is formed on a substrate 10, and a gate insulating layer 14 is formed on an entire surface of the substrate 10 including the gate electrode 12. Also, source and drain electrodes 16 and 18 are formed on the gate insulating layer 14. The source electrode 16 is formed at a predetermined interval from the drain electrode 18. Then, a semiconductor layer 20 of pentacene is formed on the source and drain electrodes 16 and 18.

To form the semiconductor layer 20 of pentacene, as shown in FIG. 2, a shadow mask 30 of a predetermined shape is positioned above the substrate 10 including the gate electrode 12, the gate insulating layer 14, the source electrode 16 and the drain electrode 18. In this state, a deposition process is performed thereon.

However, the minimum pattern width of the shadow mask 30 corresponds to about 40 µm, and the minimum pattern interval corresponds to about 120 µm. Thus, it is difficult to obtain minute patterns with the shadow mask 30 or realize high resolution.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic thin film transistor according to the preferred embodiment of the present invention will be described with reference to the accompanying drawings.

FIG. 3A to FIG. 3H are cross sectional views of the process for fabricating an organic thin film transistor according to the preferred embodiment of the present invention.

Figure 1:
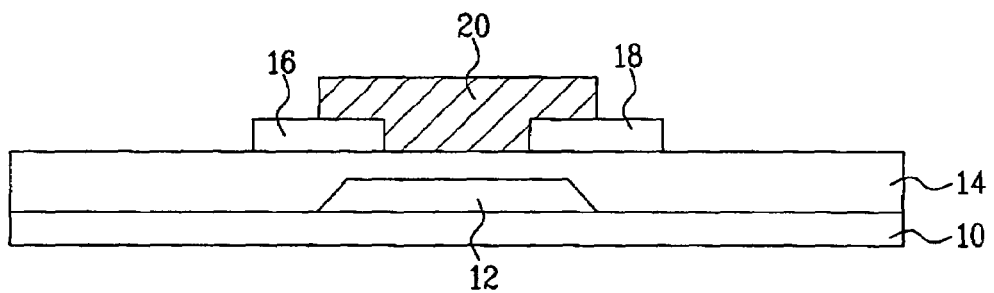
FIG. 1 is a cross sectional view of a related art organic thin film transistor with pentacene applied thereto.
Figure 2:
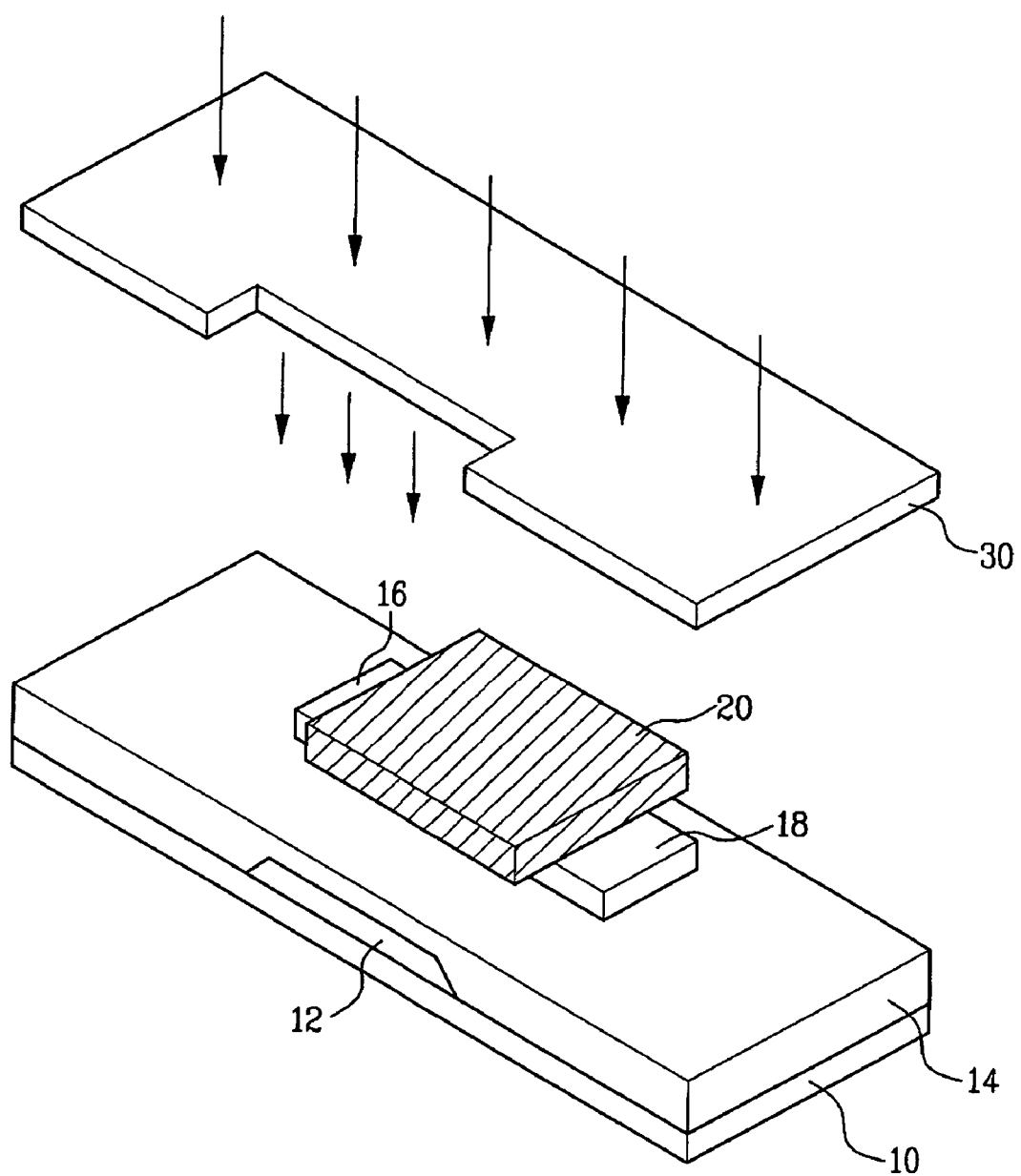
FIG. 2 is a perspective view of the process for fabricating a related art organic thin film transistor with pentacene applied thereto.
Figure 3A:
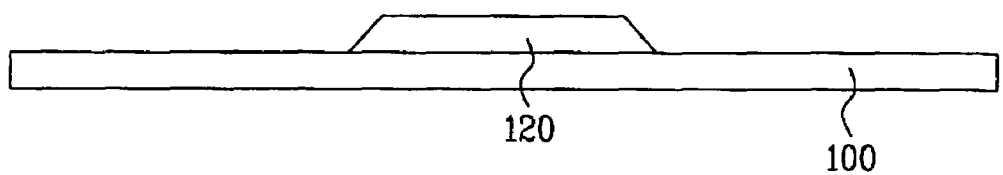
FIG. 3A to FIG. 3H are cross sectional views of the process for fabricating an organic thin film transistor according to an embodiment of the present invention.

As shown in FIG. 3A, a gate electrode 120 is formed on a substrate 100. The substrate 100 may be formed of glass, plastic, etc. For example, if the substrate 100 is formed of plastic, polyethylenenaphthalate, polyethyleneterephthalate (PET), polycarbonate, polyvinyl alcohol, polyacrylate, polyimide, polynorbornene, polyethersulfone (PES), etc. may be used. The gate electrode 120 may be formed of gold (Au), silver (Ag), copper (Cu), aluminum (Al), nickel (Ni), indium tin oxide (ITO), chrome (Cr), etc., in a common method.

Figure 3B:
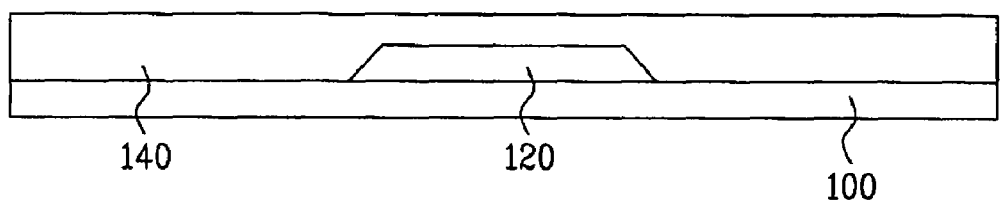

As shown in FIG. 3B, a gate insulating layer 140 is formed on an entire surface of the substrate 100 including the gate electrode 120. The gate insulating layer 140 may be formed of a ferroelectric insulating substance such as Al2O3, Ta2O5, La2O5, TiO2, Y2O3, etc., an inorganic insulating substance such as SiO, SiN, AlON, etc., or an organic insulating substance such as polyimide, benzocyclobutene (BCB), polyvinyl alcohol, polyacrylate, etc.

Figure 3C:
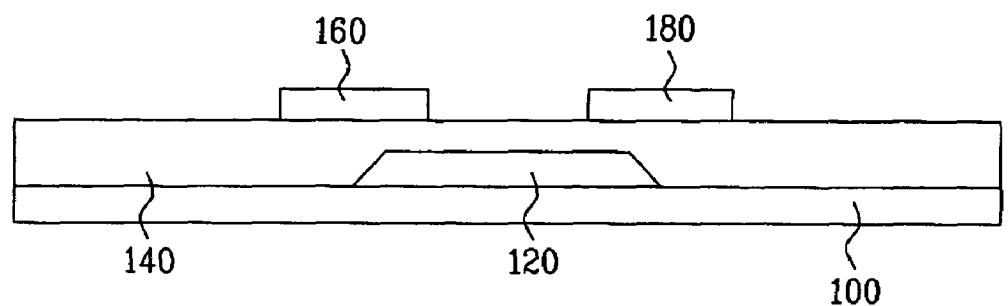

Referring to FIG. 3C, source and drain electrodes 160 and 180 are formed on the gate insulating layer 140, wherein the source electrode 160 is formed at the predetermined interval from the drain electrode 180. The source and drain electrodes 160 and 180 may be formed of gold (Au), silver (Ag), copper (Cu), aluminum (Al), nickel (Ni), indium tin oxide (ITO), chrome (Cr), etc. The source and drain electrodes 160 and 180 may be formed at the same time.

Figure 3D:
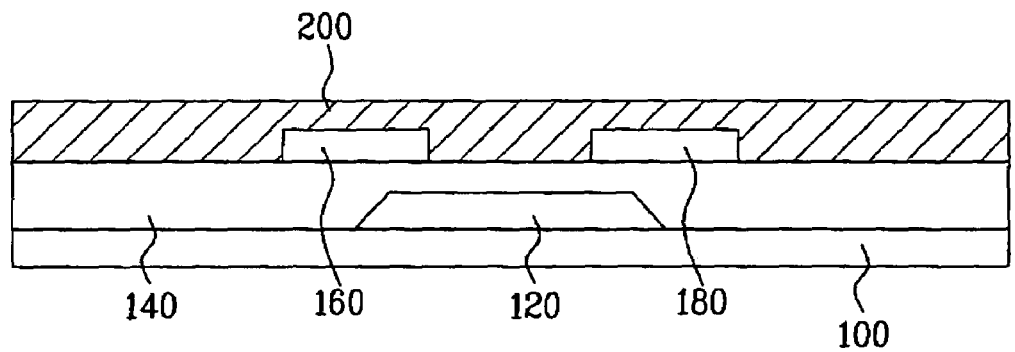

As shown in FIG. 3D, an organic semiconductor layer 200 is formed on the entire surface of the substrate 100. Preferably, the organic semiconductor layer 200 is formed of pentacene or a polymer such as $P_3HT$.

Figure 3E:
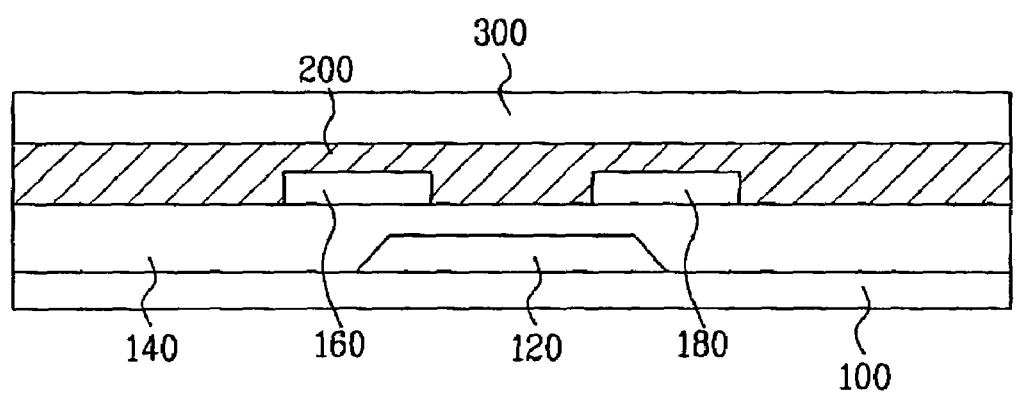

As shown in FIG. 3E, a first protection layer 300 is formed on the organic semiconductor layer 200. Preferably, the first protection layer 300 is formed of photoacrylate or poly vinyl alcohol.

The first protection layer 300 functions as a mask when patterning the organic semiconductor layer 200. Accordingly, a photoresist formed as a mask pattern in photolithography of exposure and development may substitute for the first protection layer 300. However, if the photoresist is used as the mask, the photoresist is removed after patterning the organic semiconductor layer 200. On removing the photoresist, the organic semiconductor layer 200 may be damaged due to a removal liquid (stripper or distilled water).

In the present invention, the first protection layer 300 is formed of photoacrylate or poly vinyl alcohol, which serves as the mask when patterning the organic semiconductor layer 200. Thus, removal of the first protection layer 300 after patterning the organic semiconductor layer 200 may be avoided. That is, the first protection layer 300 of photoacrylate or poly vinyl alcohol type material remains on the organic semiconductor layer 200 after patterning the organic semiconductor layer 200, whereby the first protection layer 300 protects the organic semiconductor layer 200.

Figure 3F:
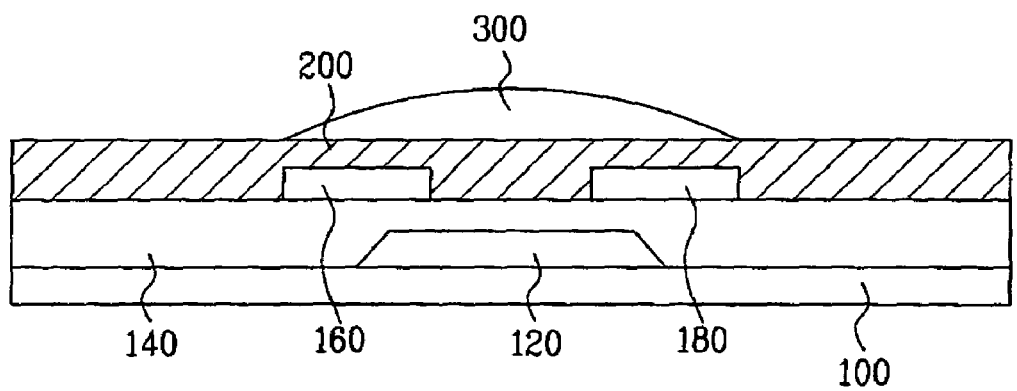

Referring to FIG. 3F, the first protection layer 300 is patterned in the predetermined shape. As explained above, the first protection layer 300 is formed of photoacrylate, poly vinyl alcohol or some other photo-sensitive material. Also, the first protection layer 300 is patterned in a predetermined shape by photolithography. As shown in FIG. 3F, the first protection layer 300 is formed on the predetermined portion of the organic semiconductor layer 200 above the gate electrode 120, the source electrode 160 and the drain electrode 180 but does not extend substantially further than the ends of the source electrode 160 and drain electrode 180.

Figure 3G:
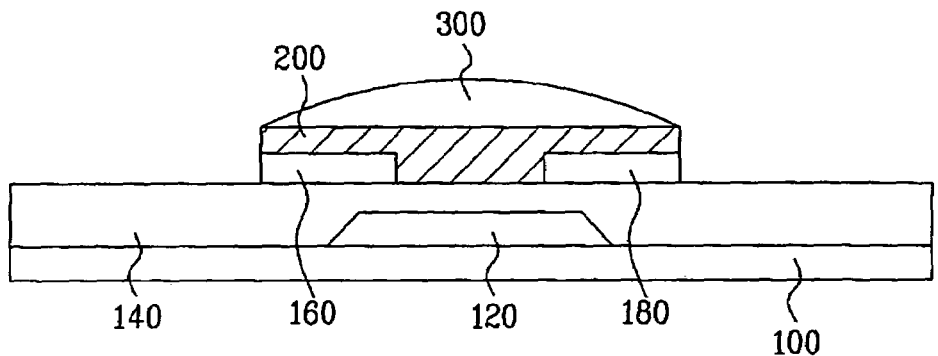

As shown in FIG. 3G, after patterning the first protection layer 300 in the predetermined shape, the organic semiconductor layer 200 is etched using the remaining first protection layer 300 as a mask. In this case, the organic semiconductor layer 200 may be dry-etched or wet-etched. If the organic semiconductor layer 200 is dry-etched, it is preferable to use oxygen plasma.

Figure 3H:
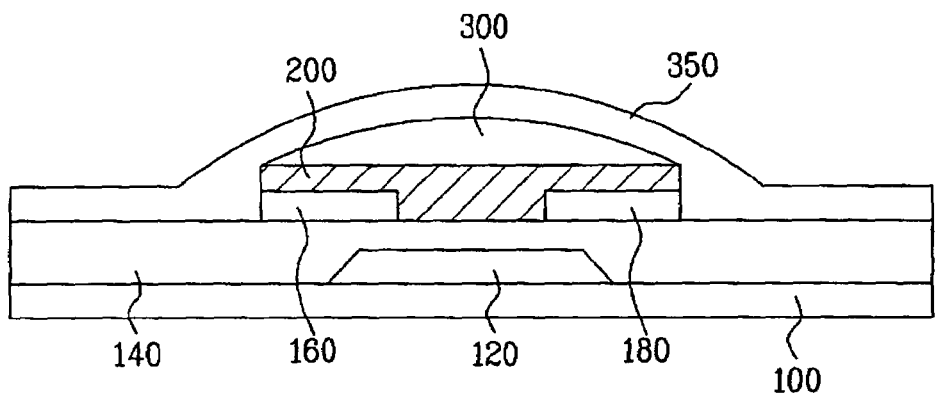

As shown in FIG. 3H, a second protection layer 350 is formed on the entire surface of the substrate 100. As mentioned above, since the first protection layer 300 functions as the mask and the protection layer, the first protection layer 300 remains on the predetermined portion of the organic semiconductor layer 200 after etching the organic semiconductor layer 200. Thereon, the second protection layer 350 is formed to obtain a complete protection layer. At this time, the second protection layer may be formed of any material that has protective characteristics, preferably, photoacrylate or poly vinyl alcohol. Thus, the first protection layer 300 and the second protection layer 350 may be formed of the same or different materials.

Figure 4:
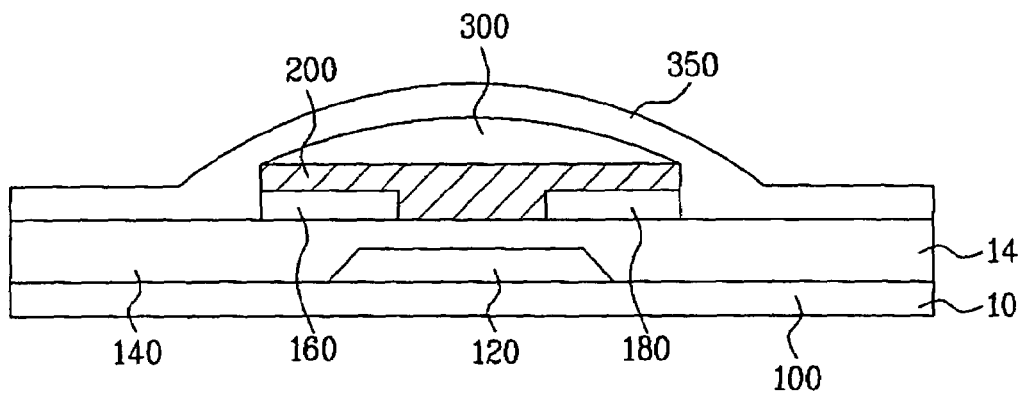
FIG. 4 is a cross sectional view of an organic thin film transistor according to an embodiment of the present invention.

Through FIG. 3A to FIG. 3H, it is possible to complete the organic thin film transistor according to the preferred embodiment of the present invention. FIG. 4 is a cross sectional view of the organic thin film transistor according to the preferred embodiment of the present invention.

In the organic thin film transistor according to the preferred embodiment of the present invention, as shown in FIG. 4, the gate electrode 120 is formed on the substrate 100, and the gate insulating layer 140 is formed on the entire surface of the substrate 100 including the gate electrode 120. Also, the source and drain electrodes 160 and 180 are formed on the gate insulating layer 140. The source electrode 160 is formed at a predetermined interval from the drain electrode 180.

The organic semiconductor layer 200 is formed above the gate electrode 120, the source electrode 160 and the drain electrode 180. The first protection layer 300 is formed on the organic semiconductor layer 200, and the second protection layer 350 is formed on the entire surface of the substrate 100 including the first protection layer 300. Thus, the first protection layer 300 and the second protection layer 350 cover different amounts of area.

Preferably, the organic semiconductor layer 200 is formed of pentacene, and the first and second protection layers 300 and 350 are formed of photoacrylate.

Figure 5:
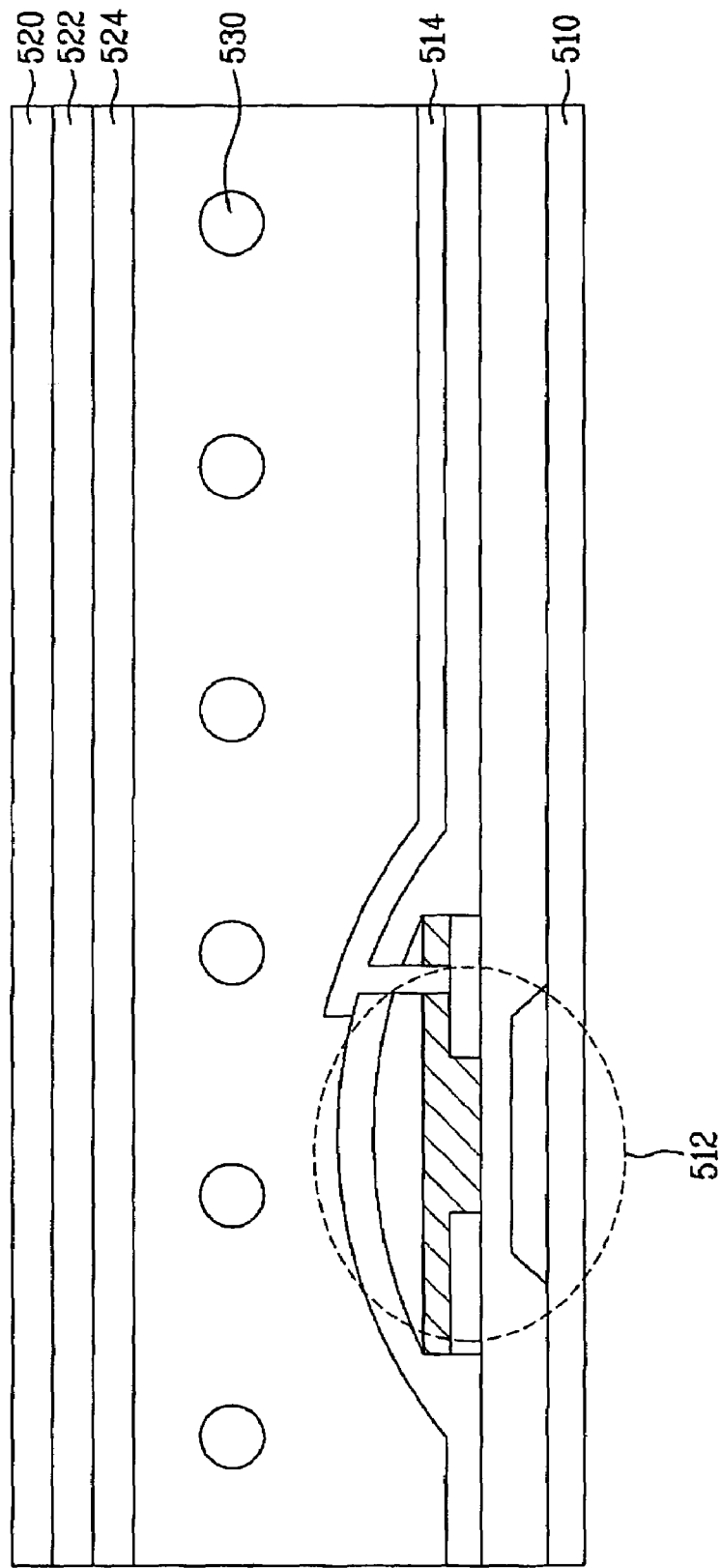
FIG. 5 is a cross sectional view of an LCD containing an organic thin film transistor according to an embodiment of the present invention.

As shown in FIG. 5, it is possible to provide an LCD device with the organic thin film transistor 512 fabricated according to the present invention. In the LCD device with the organic thin film transistor 512 fabricated according to the present invention, a first substrate 510 including the organic thin film transistor 512 is positioned in opposite to a second substrate 520, and a liquid crystal layer 530 is formed between the first and second substrates 510 and 520. In addition, a pixel electrode 514 is formed on the first substrate connected to a drain electrode of the organic thin film transistor 512, and a color filter layer 522 and a common electrode 524 are formed on the second substrate 520. To connect the pixel electrode 514 to the drain electrode of the organic thin film transistor 512, a portion of the first protection layer 300 and the second protection layer 350 are removed by a masking process to provide a contact hole and a pixel electrode layer deposited and then the pixel electrode 514 patterned using another masking process. Other components of the LCD device are not shown for simplicity in the drawing. The LCD device may have the various modifications and variations that are apparent to those skilled in the art.

Figure 6:
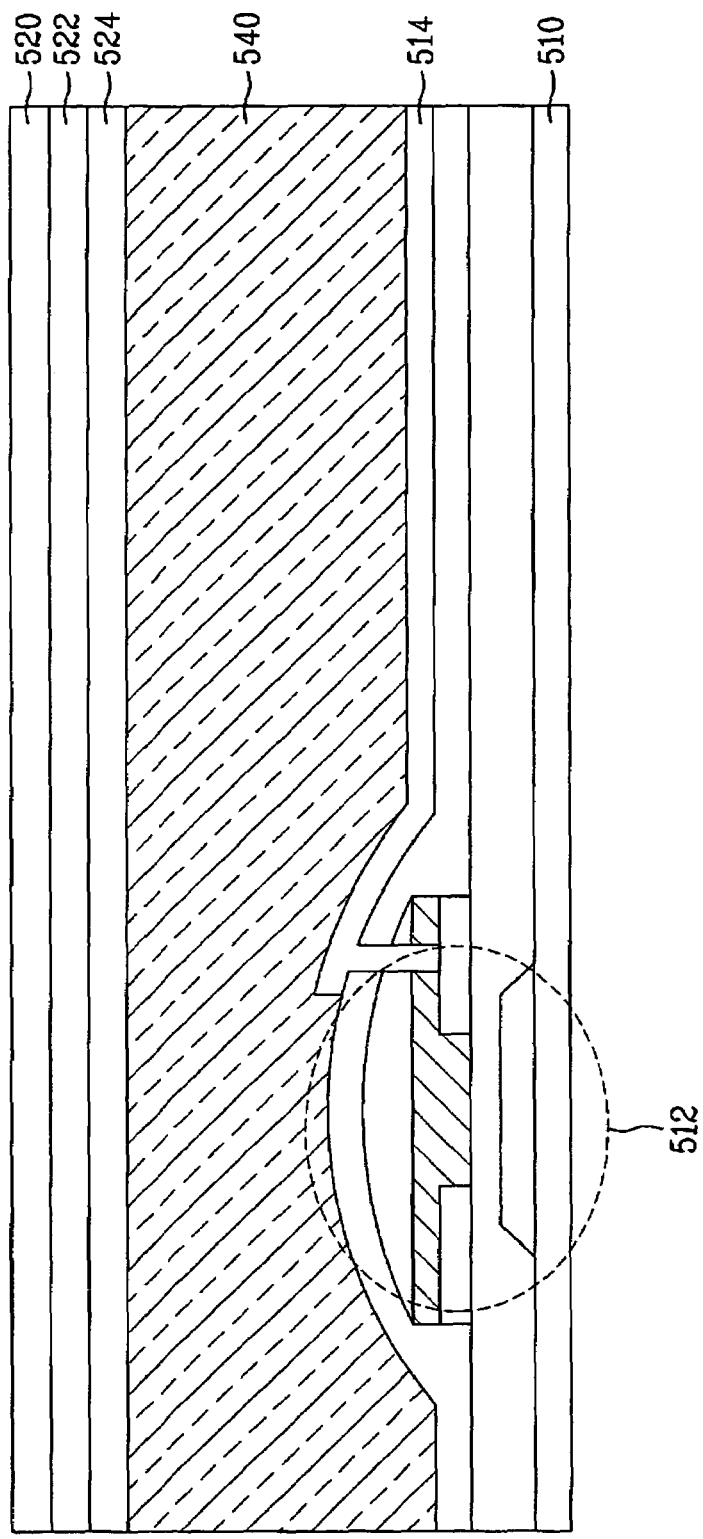
FIG. 6 is a cross sectional view of an LCD containing an electroluminescent device according to an embodiment of the present invention.
Figure 7:
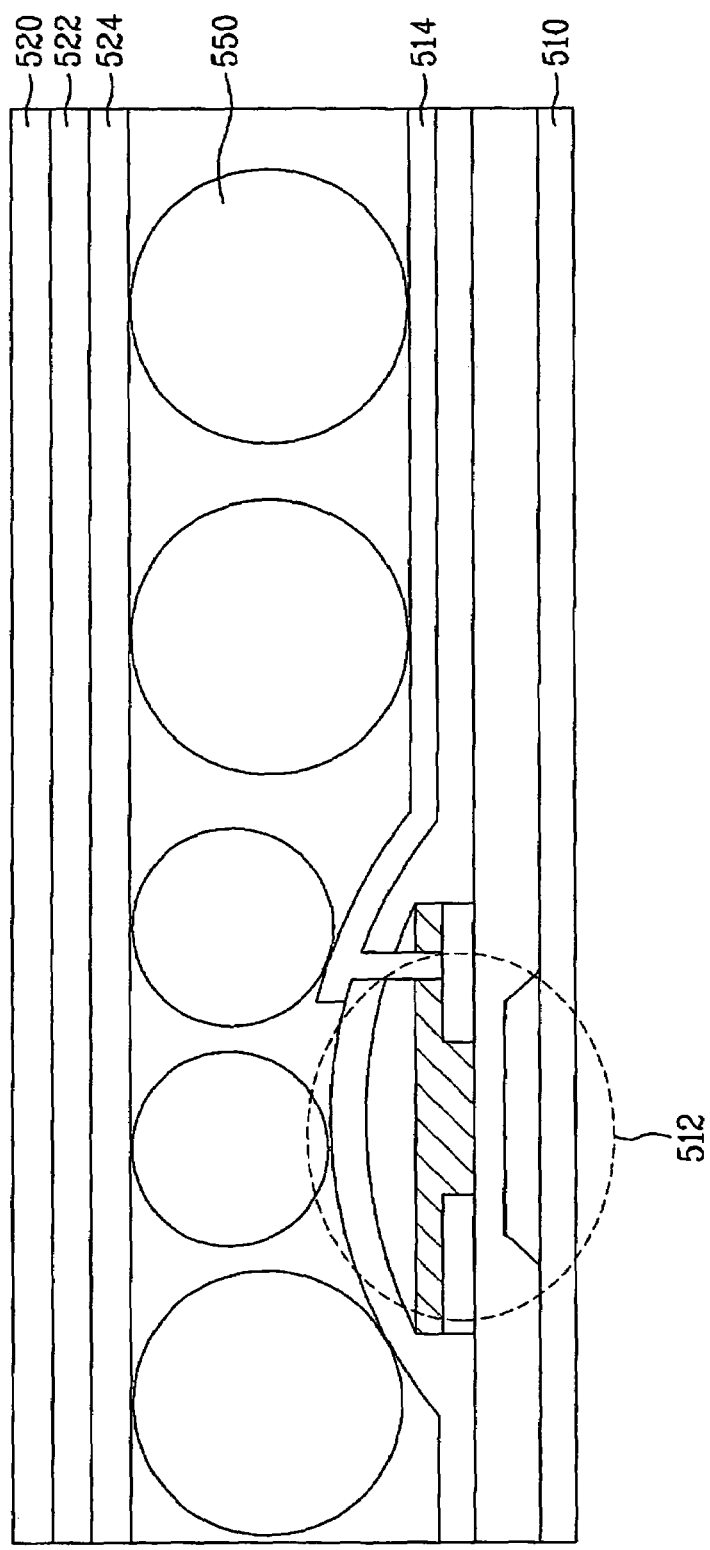
FIG. 7 is a cross sectional view of an LCD containing an electronic ink device according to an embodiment of the present invention.

Similarly, an electroluminescent layer 540 such as an organic electroluminescent layer or electronic ink (e-ink) 550 may be provided between the substrates 510 and 520, as shown in FIGS. 6 and 7, respectively. Other layers shown in FIGS. 6 and 7 are also shown in FIG. 5, thus the descriptions will be omitted herein for brevity. The electroluminescent and electronic ink devices shown in FIGS. 6 and 7 have other components that are not shown but known to those skilled in the art.

In summary, the organic semiconductor layer may be patterned using the first protection layer as the mask, so that it is possible to obtain a minute pattern. Since the first protection layer is formed from photoacrylate, a portion of the photoacrylate material layer remains after patterning the organic semiconductor layer. This prevents the organic semiconductor layer from being damaged during later processing, packaging, or operation.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an organic thin film transistor, comprising:
    forming an organic semiconductor layer on a substrate;
    forming a first protection layer on the organic semiconductor layer;
    patterning the first protection layer in a predetermined shape;
    patterning by etching the organic semiconductor layer using the remaining first protection layer as a mask; and
    forming a second protection layer that surrounds the organic semiconductor layer.

2. The method of claim 1, further comprising:
    forming a gate electrode on the substrate;
    forming a gate insulating layer on the substrate including the gate electrode; and
        forming source and drain electrodes at a predetermined interval from each other on the gate insulating layer.

3. The method of claim 1, wherein forming the second protection layer comprises depositing the second protection layer on the substrate.

4. The method of claim 1, wherein the organic semiconductor layer comprises pentacene or a polymer.

5. The method of claim 1, wherein the first protection layer comprises a photo-sensitive material.

6. The method of claim 5, wherein the first protection layer comprises photoacrylate or poly vinyl alcohol.

7. The method of claim 5, wherein the first protection layer is patterned by exposure and development.

8. The method of claim 2, wherein patterning the first protection layer comprises removing the first protection layer on portions other than over the gate electrode, the source electrode and the drain electrode.

9. The method of claim 1, wherein etching the organic semiconductor layer comprises dry-etching or wet-etching.

10. The method of claim 9, wherein the dry-etching is performed with oxygen plasma.

11. The method of claim 1, wherein the second protection layer is formed of photoacrylate or poly vinyl alcohol.

12. An organic thin film transistor comprising:
    a substrate;
    an organic semiconductor layer on the substrate, the organic semiconductor layer having sidewalls and a top surface;
    a first protection layer on the organic semiconductor layer; and
    second protection layer on the first protection layer, the first and second protection layers covering different amounts of area,
    wherein at least a portion of the sidewalls of the organic semiconductor layer are uncovered by the first protection layer.

13. The organic thin film transistor of claim 12, wherein substantially the entire top surface of the organic semiconductor layer contacts the first protection layer.

14. The organic thin film transistor of claim 12, further comprising:
    a gate electrode on the substrate;
    a gate insulating layer on the substrate including the gate electrode; and
    source and drain electrodes on the gate insulating layer at a predetermined interval from each other.

15. The organic thin film transistor of claim 12, wherein the second protection layer covers the sidewalls of the organic semiconductor layer exposed by the first protective layer.

16. The organic thin film transistor of claim 12, wherein the organic semiconductor layer comprises pentacene or a polymer.

17. The organic thin film transistor of claim 12, wherein at least one of the first or second protection layers comprises a photo-sensitive material.

18. The organic thin film transistor of claim 17, wherein the at least one of the first or second protection layers comprises photoacrylate or poly vinyl alcohol.

19. The organic thin film transistor of claim 12, wherein the second protection layer extends over substantially the entire surface of the substrate.

20. The organic thin film transistor of claim 12, wherein the first and second protection layers are comprised of different materials.

21. The organic thin film transistor of claim 12, wherein the first and second protection layers are comprised of the same material.

22. The organic thin film transistor of claim 21, wherein the first and second protection layers are comprised of photoacrylate or poly vinyl alcohol.

23. An electronic device comprising:
    a first substrate with containing an organic thin film transistor, the organic thin film transistor comprising:
        an organic semiconductor layer on the first substrate, the organic semiconductor layer having sidewalls and a top surface;
        a first protection layer on the organic semiconductor layer, at least a portion of the sidewalls of the organic semiconductor layer uncovered by the first protection layer; and
        a second protection layer on the first protection layer, the first and second protection layers covering different amounts of area; and
    a second substrate opposite to the first substrate.

24. The electronic device of claim 23, further comprising a liquid crystal layer between the first and second substrates.

25. The electronic device of claim 23, wherein the first substrate includes a pixel electrode and the second substrate includes a color filter layer and a common electrode.

26. The electronic device of claim 23, wherein substantially the entire top surface of the organic semiconductor layer contacts the first protection layer.

27. The electronic device of claim 23, further comprising:
    a gate electrode on the substrate;
    a gate insulating layer on the substrate including the gate electrode; and
    source and drain electrodes on the gate insulating layer at a predetermined interval from each other.

28. The electronic device of claim 23, wherein the second protection layer covers the sidewalls of the organic semiconductor layer exposed by the first protective layer.

29. The electronic device of claim 23, wherein the organic semiconductor layer comprises pentacene or a polymer.

30. The electronic device of claim 23, wherein at least one of the first or second protection layers comprises a photo-sensitive material.

31. The electronic device of claim 30, wherein the at least one of the first or second protection layers comprises photoacrylate or poly vinyl alcohol.

32. The electronic device of claim 23, wherein the second protection layer extends over substantially the entire surface of the substrate.

33. The electronic device of claim 23, wherein the first and second protection layers are comprised of different materials.

34. The electronic device of claim 23, wherein the first and second protection layers are comprised of the same material.

35. The electronic device of claim 34, wherein the first and second protection layers are comprised of photoacrylate or poly vinyl alcohol.

36. The electronic device of claim 23, further comprising an electroluminescent layer between the first and second substrates.

37. The electronic device of claim 23, further comprising electronic ink between the first and second substrates.

* * * * *